United States Patent [19]

Huignard et al.

[11] 4,055,838
[45] Oct. 25, 1977

[54] FERROELECTRIC INFORMATION OPTICAL STORAGE DEVICE WITH SELF BIASING

[75] Inventors: Jean Pierre Huignard; François Micheron, both of Paris, France

[73] Assignee: Thomson-CSF, Paris, France

[21] Appl. No.: 684,385

[22] Filed: May 7, 1976

[30] Foreign Application Priority Data

May 16, 1975  France .............................. 75.15438

[51] Int. Cl.$^2$ ........................... G11B 7/02; G11B 9/02
[52] U.S. Cl. .......................... 340/173.2; 340/173 LT; 340/173 LM
[58] Field of Search ...... 340/173.2, 173 LT, 173 LM, 340/173.2

[56] References Cited

U.S. PATENT DOCUMENTS 3,932,025   1/1976   Lakatos et al. .......... 340/173 LM X Primary Examiner—Stuart N. Hecker
Assistant Examiner—Donald McElheny
Attorney, Agent, or Firm—Cushman, Darby & Cushman

[57] ABSTRACT

For amplifying the photosensitivity of a ferroelectric crystal in which information is to be stored, an external field applied to the crystal is created by means of a heavily doped, reduced photocell crystal illuminated uniformly by radiation within the absorption band of the crystal. The photocell crystal connected to the terminals of the lightly doped, non-reduced ferroelectric crystal, of which the resistivity is very much higher than that of the photocell crystal, develops a very high voltage which relaxes with a high time constant. Such a voltage increases the variations in the birefraction of the ferroelectric crystal.

6 Claims, 2 Drawing Figures

FERROELECTRIC INFORMATION OPTICAL STORAGE DEVICE WITH SELF BIASING

This invention relates to an information optical storage device comprising a device for optically controlling the photosensitivily of the storage crystal.

It is known that certain ferroelectric crystals, when exposed to sufficiently intense and powerful radiation have a variable refraction index. This phenomenon is known as "optical damage."

These crystals may be used as supports for three dimensional holograms. Unfortunately, their sensitivity to radiation is low, the variation in index between the irradiated zones and the non-irradiated zones being of the order of $10^{-5}$ under normal conditions. This sensitivity is governed by the presence of impurities in these crystals, but it is not possible, within the context of storing information in the form of holograms, to increase the level of impurities present in the crystal because, if optical sensitivity increases, the optical qualities of the crystal decrease. In particular, the signal-to-noise ratio increases and, when read, the image obtained is indistinct and may even disappear.

Various methods are used for obviating this disadvantage. One of these methods is to use an electrical field during reading of the hologram to displace the index variation on the non-linear curve giving the index variation of the material as a function of the local electrical field to which it is subjected so as to amplify this index variation during reading. This is only possible in the case of ferroelectric materials having a non-linear characteristic at ambient temperature providing ambient temperature is the working temperature. Finally, it is also possible to apply to the crystal an electrical field of high amplitude so as to create during recording index variations of sufficient amplitude. In the prior art, these external electrical fields are applied by means of two electrodes arranged on the crystal and connected to a generator. When the necessary fields are high, inter-electrode arcing may occur around the crystal and only complex techniques as immersing the crystal in a dielectric medium, can avoid such a striking.

The object of the present invention is to obviate these disadvantages. To this end, the invention provides an information optical storage system comprising a device for optically controlling the photosensitivity of the recording crystal which, from an optical radiation, creates, an electrical field of high amplitude in a photocell crystal connected to the recording crystal, the external field thus applied to the recording crystal being capable of reaching values of from $10^4$ to $10^5$ V/cm and enabling a gain of the order of 10 to be obtained in the photosensitivity of the recording crystal.

For a better understanding of the invention and to show how the same may be carried into effect, reference will be made to the following description and the attached drawing in which.

It is known that certain ferroelectric crystals, referred to as "frost" at ambient temperature, can have a remanent polarisation at that temperature irrespective of the electrical field applied to them.

This is the case with lithium niobate which, when heated to 1,000° C and then subjected to an electrical field and cooled in that field, retains a remanent polarisation which can only be made to fluctuate by reheating.

These crystals cannot be used for obtaining considerable variations in birefraction by variation of the electrical field applied around the value of the coercive field due to the fact that the electrical polarisation is unable to fluctuate under normal conditions.

However, due to the existence of a remanent polarisation, an internal electrical field exists in the crystal. The application of a sufficiently intense external electrical field, added vectorially to the internal field, thus produces a decrease or increase in photosensitivity, depending on whether the resulting field is weaker or stronger than the internal field. Accordingly, the sense and direction of the external field applied to the crystal relative to the internal field influence the photosensitivity of the material. In particular, if the external field and the internal field are co-linear and in the same sense, the resulting field is strong. The space charge field created by the spatial variations in irradiation during the recording of a hologram in this crystal (this field tends to oppose the resulting field and comprises a fixed component and a component variable in space) is superimposed upon the resulting field and produces a variation in the local field in the crystal associated by a non-linear relation with the variation of index in this crystal.

The amplitude of the local field varies in the same way as the amplitude of the variable component of the space charge field and is governed both by the amplitude of the resulting field and by the intensity of irradiation.

Figure 1:
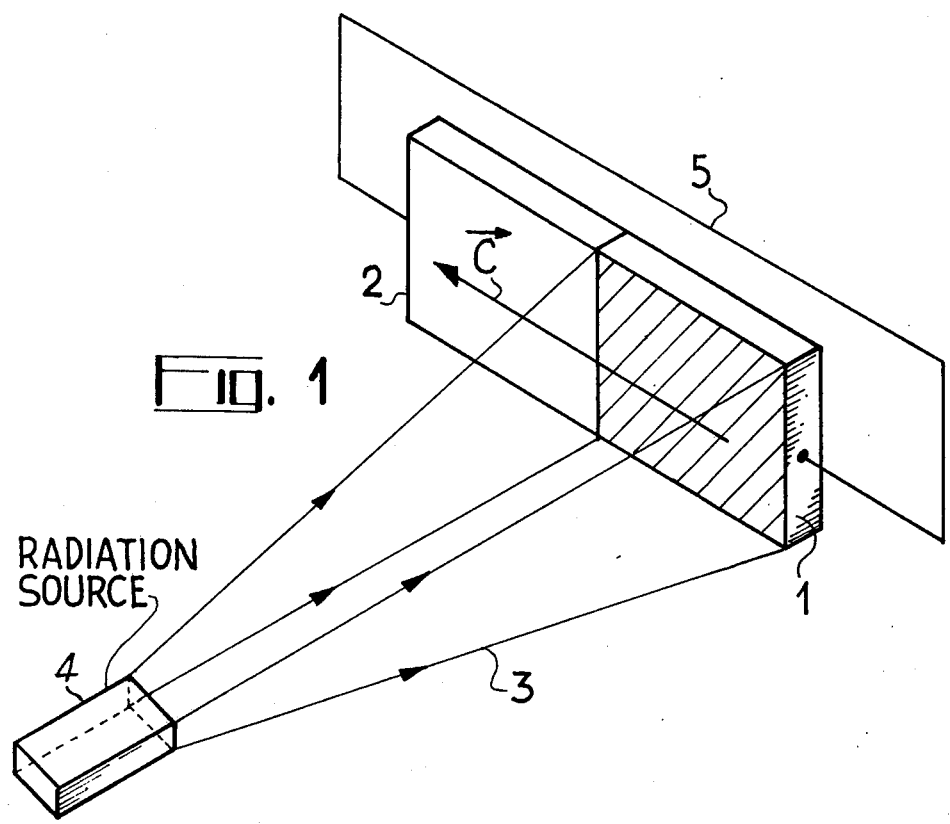
FIG. 1 illustrates an optical storage device according to the invention previously to the storage.
Figure 2:
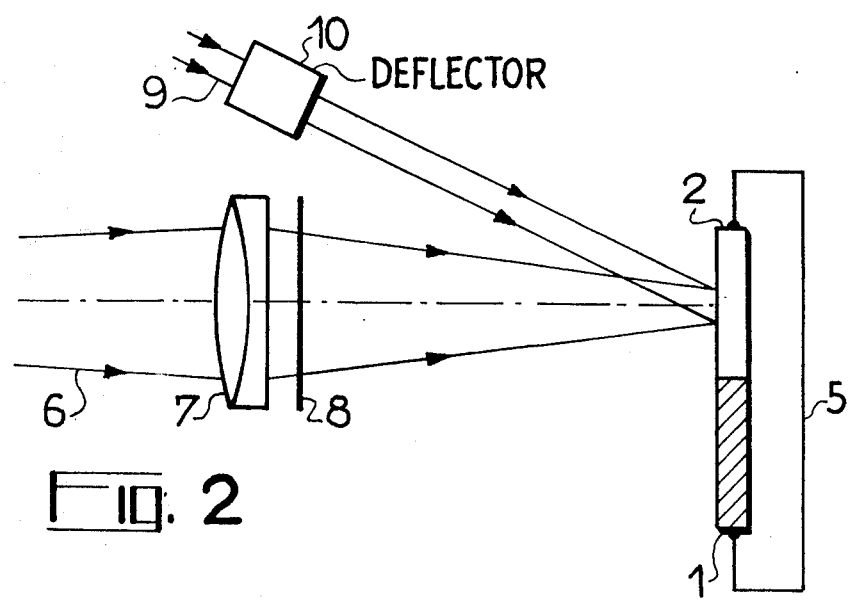
FIG. 2 illustrates an optical storage device in a phase of storage.

FIG. 1 shows a simple device for controlling the photosensitivity of the crystal which enables an intense external field to be applied to the crystal.

This device comprises a doped and reduced pyroelectric crystal 1 which is uniformly excited by sufficiently intense radiation 3 from a source 4 which may be an incoherent source or a multimode laser source which emits radiation in the absorption band of the crystal. This radiation creates a photocurrent due to the migration of photoexcited particles along the polar axis $\vec{C}$ of the crystal. A voltage developed at the terminals of the crystal corresponds to this photocurrent. This voltage may be measured across a high impedance in relation to that of the crystal. This voltage is proportional both to the absorption coefficient of the doped and reduced crystal and to the incident power density.

Thus, in the case of a lithium niobate crystal doped with 0.015% of iron and subjected to irradiation with a power density of 1 W/cm², the field developed at its terminals is of the order of $10^4$ to $10^5$ V/cm.

The volumn resistivity of this crystal is of the order of $10^{13}$ Ω.cm.

The field developed by this photocell crystal 1 may thus be used for subjecting a recording crystal, such as 2, to an intense external field, provided that the resistivity of this recording crystal is very much higher than that of the photocell crystal.

The crystal used for recording is a lightly doped, non reduced crystal with a high level of resistivity. Such a crystal is adapted for holographic recording because it has favourable optical qualities and high diffraction power. In practice, the crystals 1 and 2 may be two parts of one and the same crystal, for example lithium niobate, the part 1 being heavily doped, whilst the part 2 is left in the form resulting from preparation of the crystal, i.e. lightly doped by iron atoms (0.005% ) and, hence, substantially non-absorbent to the radiation used for reading (a few percent). A conductor wire 5 connects the faces of the crystals 1 and 2 perpendicular to the crystallographic axis $\vec{C}$.

The photocell crystal may be illuminated either before or during recording, because the field developed at the terminals of the photocell crystal relaxes with a time constant governed by the dielectric constant of the crystal which is itself proportional to its resistivity. It is thus very high, being of the order of the storage time of the holograms. By virtue of the relative arrangement of the photcell and recording crystals and the positioning of the polar axis $\vec{C}$ of the crystal, the internal field and the external field applied are combined with one another in the recording crystal and the conditions for obtaining optimum efficiency are fulfilled.

The corresponding optical storage device is shown in FIG, 2, in which the same elements are denoted by the same references as in FIG. 1.

In particular, the optical control device comprises a heavily doped, reduced photocell crystal 1 connected to a lightly doped, non-reduced recording crystal 2 on the one hand by a conductor wire 5 and on the other hand by contact with this recording crystal, this device having been uniformly irradiated beforehand as indicated in FIG. 1.

A substantially parallel beam 6 coming from a monomode laser source emitting radiation of suitable wavelength (in the absorption band of the recording crystal) is made convergent by means of a lens 7. This beam, known as the object beam, irradiates a flat object 8 of which it is desired to record the hologram.

A reference beam 9, which also comes from the monomode laser source and which is suitably oriented by means of an optical device, passes through a deflector 10 which orients the beam to determine the recording zone in the crystal. A network of interference fringes is thus created between the object beam and the reference beam. An index network is created under the effect of these spatial variations in irradiation, the index variations being amplified, as mentioned above, by the action of the external electrical field created by means of the photocell crystal.

During reading by the signal reference beam, the diffraction efficiency obtained (ratio between the power received and the incident power) may reach 50% whereas it only amounts to a few % in the absence of an applied electric field. It should be noted that a crystal such as lithium niobate is photosensitive, ferroelectric but also piezoelectric and that, accordingly, it is deformed under the action of electrical fields.

The memory effect of the photocell crystal, attributable to the fact that the electrical field created by the crystal relaxes with a high time constant, means that this deformation is substantially permanent and that the sign network recorded is substantially the same as that which is read. Accordingly, the image obtained during reading corresponds to the object which gave rise during recording to the index network.

It should also be noted that the time constant for optical erasure by uniform irradiation of the recording crystal is not modified consecutively upon this increase in photosensitivity and, hence, diffraction efficiency.

Experience has shown that a lightly doped (0.005% of iron) and non-reduced $LiNbO_3$ crystal with an absorption coefficient of a few % at the recording wavelength of 4,880 A for radiation supplied by an argon laser source, only enables a diffraction efficiency of the order of 5% to be obtained for an incident power density of 0.6 W/cm$^2$.

The same crystal coupled to an $LiNbO_3$ photocell crystal, doped with 0.015% of iron and reduced, measures 7 mm (wide) × 7 mm (long) × 3 mm (thick), has an absorption coefficient of 50% at a wavelength of 4,880 A and a resistivity of $10^{13}$ Ω.cm, enables a diffraction efficiency of the order of 50% to be obtained for the same incident power of 0.6 W/cm$^2$ and the same exposure time. By rotating the reference beam or by changing the wave length of the laser source used for recording, the storage system enables a large number of images to be superposed within the thickness of the crystal.

What we claim is:

1. An information optical storage device comprising a lightly doped non-reduced ferroelectric cyrstal for holographic storage of information, a heavily doped reduced photocell crystal, having an absorption frequency band, adapted for being photoexcited by means of a uniform luminuous radiation having a frequency band within said absorption band, said photocell crystal thus producing an electrical field, and direct connecting means for applying said electrical field to said ferroelectric crystal, being formed by the common edge between the two crystals and by a conductor wire connecting the two faces opposite the said common edge, said ferroelectric crystal having a very much higher resistivity than said photocell crystal.

2. An information optical storage device as claimed in claim 1, wherein, said ferroelectric crystal having a crystallographic axis, said electrical field is applied parallel to said crystallographic axis, maximum photosensitivity thus being obtained.

3. An information optical storage device as claimed in claim 2, wherein said connecting means are formed by two direct connections between the photocell crystal and said ferroelectric crystal.

4. An information optical storage device as claimed in claim 2, wherein said electrical field created by photoexcitation of the photocell crystal relaxes with a high time constant after the radiation has been switched off.

5. An information optical storage device as claimed in claim 4, wherein said ferroelectric crystal and said photocell crystal are two joined coplanar parts of one and the same rectangular plate of photosensitive ferroelectric material, said parts being limited by a common edge orthogonal to said crystallographic axis, one of said parts being lightly doped and non-reduced and the other of said parts being heavily doped and reduced, the lateral edges of said rectangular plate which are perpendicular to said crystallographic axis.

6. An information optical storage device as claimed in claim 5, wherein said ferroelectric crystal is lithium niobate lightly doped with iron and having a remanent polarisation at ambient temperature, inducing an internal field, the photosensitivity of said ferroelectric crystal being maximal when the sum of said internal field and of said electrical field applied by means of said photocell crystal is maximal.

* * * * *